United States Patent [19]

Hengesh et al.

[11] Patent Number: 4,458,123
[45] Date of Patent: Jul. 3, 1984

[54] CONNECTOR FOR ATTACHING AN ELECTRICAL COMPONENT TO A MEMBRANE KEYBOARD

[75] Inventors: Harold F. Hengesh, Waukegan; Michael J. Marcier, Cherry Valley; Anthony J. Van Zeeland, Crystal Lake, all of Ill.

[73] Assignee: Oak Industries, Inc., Rancho Bernardo, Calif.

[21] Appl. No.: 414,628

[22] Filed: Sep. 3, 1982

[51] Int. Cl.³ .............................................. H01H 9/00
[52] U.S. Cl. ................................ 200/159 B; 200/294; 200/310; 339/17 D
[58] Field of Search .................... 200/159 B, 294, 310, 200/313, 314; 339/17 F, 176 MF, 17 D

[56] References Cited

U.S. PATENT DOCUMENTS 3,757,270 9/1973 Dupree .............................. 339/17 D
3,955,124 5/1976 Jones ............................ 339/17 D X
4,262,182 4/1981 Basler ................................. 200/314

FOREIGN PATENT DOCUMENTS 2416571 10/1979 France ............................. 339/17 D Primary Examiner—John W. Shepperd
Assistant Examiner—Renee S. Kidorf
Attorney, Agent, or Firm—Kinzer, Plyer, Dorn & McEachran

[57] ABSTRACT

An attachment for incorporating discrete electrical components in a membrane switch panel. The component is attached to a base member which in turn is secured to the membrane switch panel, either mechanically or adhesively. At least one pair of holes is cut in the membrane and spacer of the membrane switch panel. The leads of the electrical component extend through these holes and into contact with the electrical circuit on the substrate of the switch panel.

5 Claims, 5 Drawing Figures

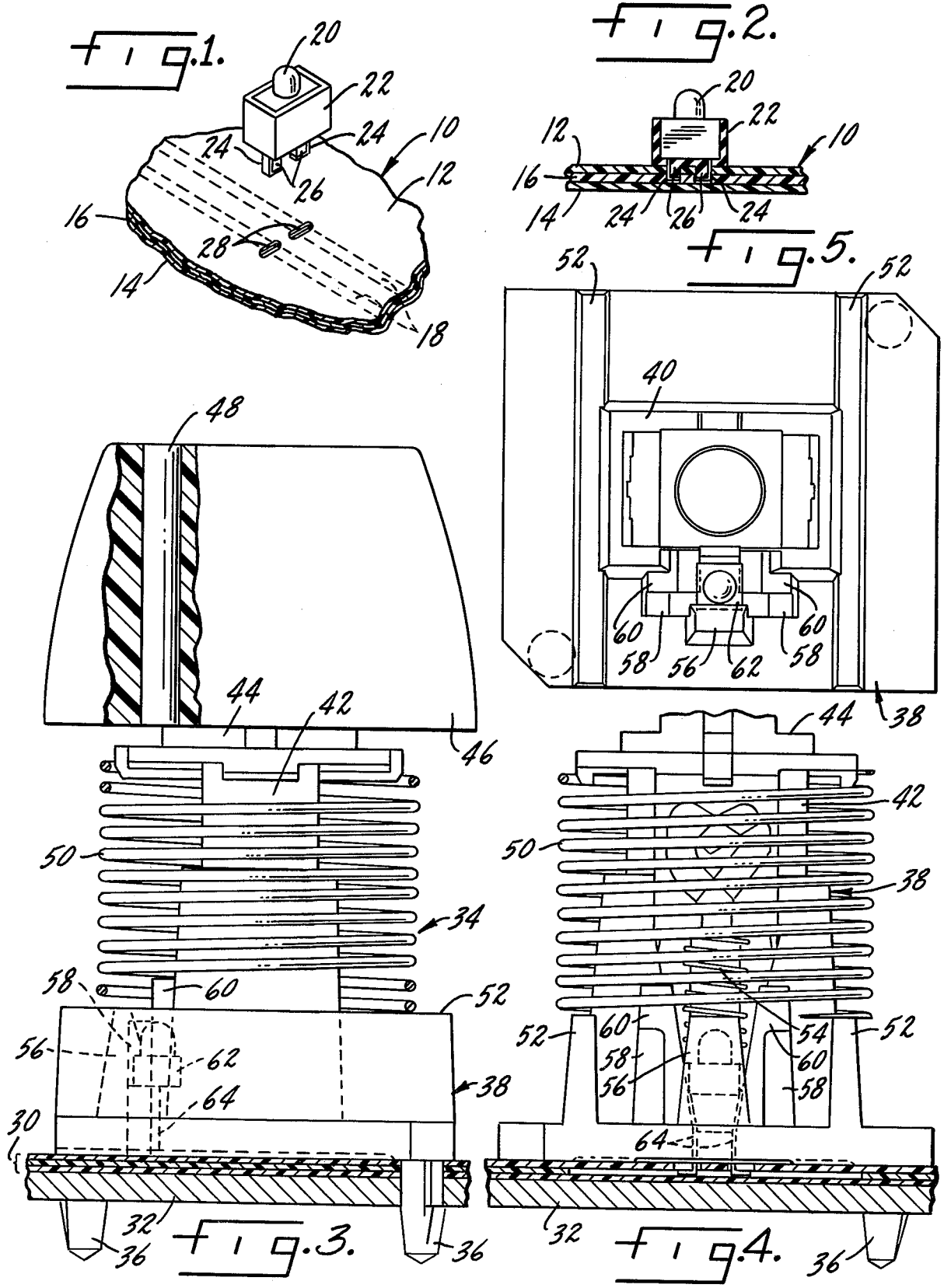

CONNECTOR FOR ATTACHING AN ELECTRICAL COMPONENT TO A MEMBRANE KEYBOARD

SUMMARY OF THE INVENTION

This invention relates to membrane switch technology and is particularly directed to means for incorporating discrete electrical components in a membrane switch panel.

It is an object of the present invention to provide an economical attachment for incorporating discrete electrical components in a membrane switch.

Another object is a component attachment which can be placed anywhere on a membrane switch panel.

Another object is an attachment for discrete electrical components utilizing the keys of a membrane switch keyboard.

Another object is an attachment for discrete electrical components which can be adhesively secured to a membrane switch.

Another object is an attachment for discrete electrical components in which electrical connection is made by simply pressing the component and its base into place.

Other objects will appear from time to time in the following specification, drawings and claims.

BRIEF DESCRIPTION OF THE DRAWINGS

FIG. 1 is an exploded, perspective view of a component attachment according to the present invention.

FIG. 2 is a section through an assembled membrane switch with an electrical component attached thereto.

FIG. 3 is a side elevation view of an alternate form of the invention wherein the component is held in place by a switch actuator or key.

FIG. 4 is a side elevation view of the actuator.

FIG. 5 is a plan view of an actuator housing, showing the location of the enclosure for the electrical component.

DESCRIPTION OF A PREFERRED EMBODIMENT

Membrane switches are increasingly being used in a variety of applications such as typewriter keyboards, computer terminals, cash registers, calculators, appliance control panels and toys and games. Membrane switches commonly comprise a flexible membrane made of plastic film. The switch also has a substrate which may be either rigid or flexible. A spacer lies between the membrane and substrate. Electrical circuitry is formed on the facing surfaces of the membrane and substrate. Openings in the spacer permit contact between the circuit elements in response to external pressure on the membrane. Assorted forms of actuators may be used in conjunction with the basic membrane switch. Such forms include snappable domes or protrusions formed either in the membrane itself or in a separate layer which lies on top of the membrane. Or the actuators could be a mechanical type wherein the user presses a button or key which transmits a force to the membrane.

The electrical circuitry on the membrane and substrate is usually a conductive ink which is applied as a liquid and then dried. This permits formation of circuits in any configuration and allows the composite switch to be very thin. The use of printed conductors, however, makes it difficult to connect discrete electrical components to the membrane switch circuits. The inherent incompatibility of discrete components with the printed conductors of the membrane switch has prompted the use of specially adapted connectors for applying the components to a switch panel. While this can be done in a variety of ways the formation of special connecting points in the membrane switch limits the flexibility of where the components can be located. Special connectors also increase the cost of a membrane switch.

The present invention provides a component attachment which is simple to make and reliable in operation. A particular advantage of the invention is discrete components can be located anywhere on the membrane switch panel. No separate tails or connecting tabs need be formed in either the membrane or substrate. All that is required is the provision of appropriate electrical leads and this can be simply done during application of the electrical circuitry.

One of the most common applications of discrete components to a membrane switch is the incorporation of a light emitting diode or LED. LED's may be placed throughout a switch panel to provide information to the user. Since the location of such indicators can be as varied as the functions to which a membrane switch may be put, it is clear that an attachment for an LED must be capable of being placed anywhere on the switch panel. The present invention provides such an attachment.

FIGS. 1 and 2 illustrate one form of attachment according to the present invention. A membrane switch panel is indicated generally at 10. It includes a membrane 12, a substrate 14 and an intervening spacer 16. It will be understood that the membrane and substrate will carry appropriate electrical circuitry for forming the switch sites of a membrane switch panel. Included in this circuitry will be conductive traces for connection to a discrete electrical component. Such traces are shown in FIG. 1 at 18.

A discrete electrical component such as an LED 20 is secured to a base member 22. In the embodiment shown in FIGS. 1 and 2, the base member is made of rubber. The rubber is molded around the component 20. The component has electrical leads 24 which extend through the bottom of the base member 22. The leads may be formed around legs 26 which extend from the bottom of the base member. The membrane and spacer have aligned openings 28. These openings expose the traces 18. Connection of the electrical component is made by placing a component such that the leads 24 extend down into the openings 28 and into contact with traces 18. Preferably the underside of the base member 22 has an adhesive which bonds the base member to the surface of the membranes surrounding the openings 28. It can be seen that this attachment allows placement of a component wherever there are appropriate leads 18. Also it will be noted that the legs 26 of the base member 22 together with the membrane and spacer material between the holes 28 provide insulative material which prevents migration between the conductive material of the leads 24. In this connection, it is not necessary that two separate pairs of holes 28 be formed. Rather, it could be a single pair of larger openings which accommodates both electrical leads of the discrete component. In an embodiment with a single pair of openings for the leads some insulative separator would be required between the leads to prevent migration.

An alternate form of the invention is shown in FIGS. 3–5. In this form the membrane switch panel 30 rests on a relatively rigid plate 32. An actuator or key 34 rests on the membrane switch and the plate. This key may be similar to that shown in Larson, et al., U.S. Pat. No. 4,367,380, issued Jan. 4, 1983. Reference is made to that patent for details of the key structure and operation. The key 34 includes legs 36 which may be staked to the plate 32 to anchor the key in place. The key also has a housing 38 with a central chamber 40 which defines a cavity or channel. A plunger 42 is reciprocally movable within the channel. The plunger has a head 44 to which a keytop 46 may be attached. The keytop includes a light pipe 48 which transmits light from the underside of the keytop to its upper surface. The plunger is biased upwardly by a spring 50. The spring bottoms on a pair of walls 52 which are part of the housing 38. A second spring 54 (FIG. 4) extends from the plunger to the surface of the membrane switch 30. It is this spring which transmits the actuating force to the membrane.

The housing 38 has an enclosure formed at one side thereof. The enclosure is defined by a catch 56, a pair of side posts 58, and two back walls 60. An electrical component, such as an LED, is contained within the compartment formed by the catch, side posts and back walls. An LED is shown at 62 with leads 64 extending downwardly. The leads extend through openings in the membrane and spacer of the switch 30. These openings are similar to those shown in FIG. 1. Thus it can be seen that the key 34 serves as a base member for securing the component 62 to the membrane switch. The leads extend into contact with the circuitry on the substrate.

Whereas a preferred form of the invention has been shown and described, it will be understood that many changes, modifications and alterations could be made thereto without parting from the scope of the invention.

I claim:

1. In a membrane switch panel of the type having a flexible membrane, a substrate and a spacer between the membrane and substrate, electrical circuitry formed on the membrane and substrate and arranged to provide at least one membrane switch site, the improvement comprising means for attaching to the membrane switch panel a discrete electrical component having leads, said means including a base having a pair of depending legs, the underside of the base being adhesively secured to the top surface of the membrane switch panel and at least one pair of aligned openings in the membrane and spacer, the component being attached to the base with the component's leads wrapped around the bottom of the legs of the base, the legs and leads extending through said openings such that the leads contact the circuitry on the surface of the substrate, the component's leads being held in contact with the electrical circuitry by being trapped between the base and the substrate.

2. The structure of claim 1 wherein there are two pairs of aligned openings in the membrane and spacer, with one lead extending through each pair of aligned openings 3. The structure of claim 1 wherein the base is made of rubber molded around the electrical component.

4. The structure of claim 1 further characterized in that the leads of the electrical component are separated by an insulator so as to prevent migration between the leads.

5. The structure of claim 1 wherein the electrical component is a light emitting diode.

* * * * *